United States Patent [19]

Nishiguchi

[11] Patent Number: 5,122,481
[45] Date of Patent: Jun. 16, 1992

[54] SEMICONDUCTOR ELEMENT MANUFACTURING PROCESS USING SEQUENTIAL GRINDING AND CHEMICAL ETCHING STEPS

[75] Inventor: Masanori Nishiguchi, Yokohami, Japan

[73] Assignee: Sumitomo Electric Industries, Ltd., Osaka, Japan

[21] Appl. No.: 754,906

[22] Filed: Sep. 4, 1991

[30] Foreign Application Priority Data

Sep. 5, 1990 [JP] Japan .................................. 2-235152

[51] Int. Cl.⁵ .................... H01L 21/00; H01L 21/02; B24B 1/00
[52] U.S. Cl. .................................. 437/225; 437/228; 437/974; 148/DIG. 51; 148/DIG. 135; 156/625; 156/DIG. 111; 51/131.3; 51/281 R
[58] Field of Search ............... 437/225, 228, 974; 148/DIG. 51, DIG. 135; 156/625, DIG. 111; 51/131.3, 165, 281 R, 281 SF

[56] References Cited

U.S. PATENT DOCUMENTS

| 4,226,056 | 10/1980 | Komanduri et al. | 51/209 R |
| 4,411,107 | 10/1983 | Sekija et al. | 51/325 |
| 4,587,771 | 5/1986 | Buchner et al. | 51/281 SF |
| 4,947,598 | 8/1990 | Sekiya | 51/283 R |
| 5,035,087 | 7/1991 | Nishiguchi et al. | 51/131.3 |

FOREIGN PATENT DOCUMENTS

| 2505713 | 11/1982 | France | 51/283 R |
| 0393073 | 12/1973 | U.S.S.R. | 51/325 |

OTHER PUBLICATIONS

Nishiguchi, M., "High Mechanical Reliability of Back-ground GaAs LSI Chips with Low Thermal Resistance", Proceedings of the 41st Electronic Components and Technology Conf., May 1991, pp. 890–896.

Primary Examiner—Brian E. Hearn
Assistant Examiner—B. Everhart
Attorney, Agent, or Firm—Beveridge, DeGrandi & Weilacher

[57] ABSTRACT

There is disclosed a method of manufacturing a semiconductor device comprising the steps of: forming a semiconductor element on one of major surfaces of a GaAs substrate; a grinding the substrate to make the GaAs substrate to a predetermined thickness by grinding the other surface of the GaAs substrate with a grinding stone having an average grain size of 6 micro-meters or larger; and an chemical etching the other surface of the substrate by 0.6 micro-meters or more just after the grinding step, without any further grinding treatment done on the other surface, just after the grinding step.

3 Claims, 3 Drawing Sheets

SEMICONDUCTOR ELEMENT MANUFACTURING PROCESS USING SEQUENTIAL GRINDING AND CHEMICAL ETCHING STEPS

BACKGROUND OF THE INVENTION

1. Field of the Invention

The present invention relates to a method of manufacturing a semiconductor device and more particularly relates to a treatment of a back surface of a GaAs substrate on which a semiconductor device is formed.

2. Related Background Art

A semiconductor element formed on a GaAs Substrate, a chemical compound semiconductor, has a difficulty to dissipate heat generated from the device formed on a surface of the GaAs substrate, since thermal conductivity of GaAs is ⅓ times as low as that of Si. It adversely affects characteristics of the device. And, it is necessary to thin the substrate and assure a good dissipation of heat. On the other hand, GaAs is brittle compared with Si and easy to be cracked and/or broken off. So, chip cracking is easily caused starting from fine flaws and the like yielded at a thinning process. Therefore, mirror surface finish has been conventionally adopted with a grinding stone having fine grain sizes (See "THE IMPACT OF WAFER BACK SURFACE FINISH ON CHIP STRENGTH" of IEEE/IRPS). And, an application filed by the assignee and inventor of the present invention on Dec. 5, 1986 also disclosed that GaAs substrate has the maximum strength after die-bonding when back finish (R max) of the substrate is somewhat between 0.2 and 0.5 micro-meters. It is, however, difficult to obtain R max in this region only with grinding. And, in the prior art, mirror grinding has been used to obtain R max of 0.1 micro-meters or finer to eliminate fine flaws, consequently preventing a chip from being cracked.

A grinding stone with fine grains, however, must be used to perform the aforementioned mirror grinding. It means only a small amount to be ground off per a unit time and taking a long time of period to grind off a predetermined amount. It results in low productivity for mass production and in making a process complicated because of a need of facilities for mirror grinding.

SUMMARY OF THE INVENTION

In view of the above mentioned circumstances. it is an object of the present invention to provide a semiconductor device manufacturing process, wherein a back treatment can be performed in a short time of period and also semiconductor device can be manufactured with minimum chip cracking.

It is further object of the present invention to provide a method of manufacturing a semiconductor device comprising the steps of: forming a semiconductor element on one of major surfaces of a GaAs substrate; a grinding the substrate to make the GaAs substrate to a predetermined thickness by grinding the other surface of the GaAs substrate with a grinding stone having an average grain size of 6 micro-meters or larger; and an chemical etching the other surface of the substrate by 0.6 micro-meters or more just after the grinding step, without any further grinding treatment done on the other surface, just after the grinding step.

In a method according to the present invention, a grinding stone with a grain size of 6 micro-meters or larger is used to grind a GaAs substrate, on which a semiconductor element is formed. in a short time of period. And thereafter a chemical etching removes a deformed layer on a back surface of the substrate caused by the above mentioned grinding step. It enables to manufacture a GaAs substrate with high strength. in a short time of period.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Referring to Drawings, an embodiment according to the present invention is explained as follows.

Figure 1:
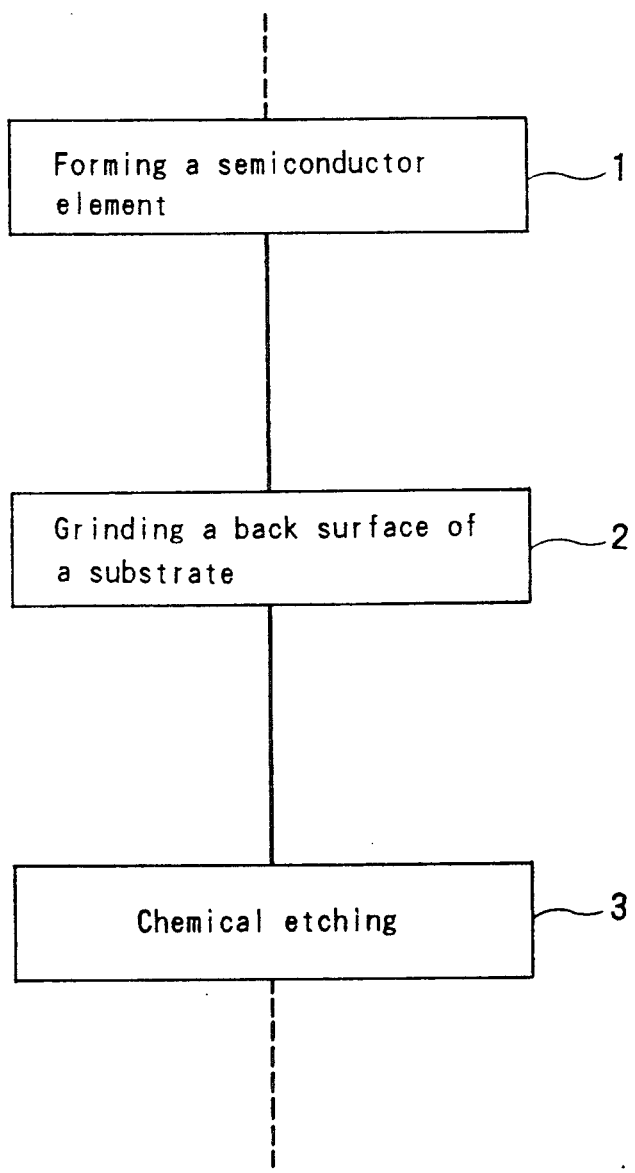
FIG. 1 shows a summarized flow chart of characterizing portions of an embodiment according to the present invention.

As shown in FIG. 1, the characterizing process is comprised of step 1 of forming a semiconductor element on a surface of the GaAs substrate, step 2 of grinding off a back side of the GaAs substrate on which the semiconductor element is formed. and a step 3 of performing chemical etching to remove the back side by a predetermined thickness, just after the grinding step.

Concretely. a semiconductor element is formed on one of main surfaces of the GaAs wafer first. The semiconductor element is, for example Shottky-gate type field effect transistor or the like and on the one main surface, monolisic microwave integrated circuit or the like is formed by such field effect transistors. This step is performed utilizing photo-lithograph technique, ion implantation technique and the like. These are not described in detail here, as conventionally well known.

Figure 2:
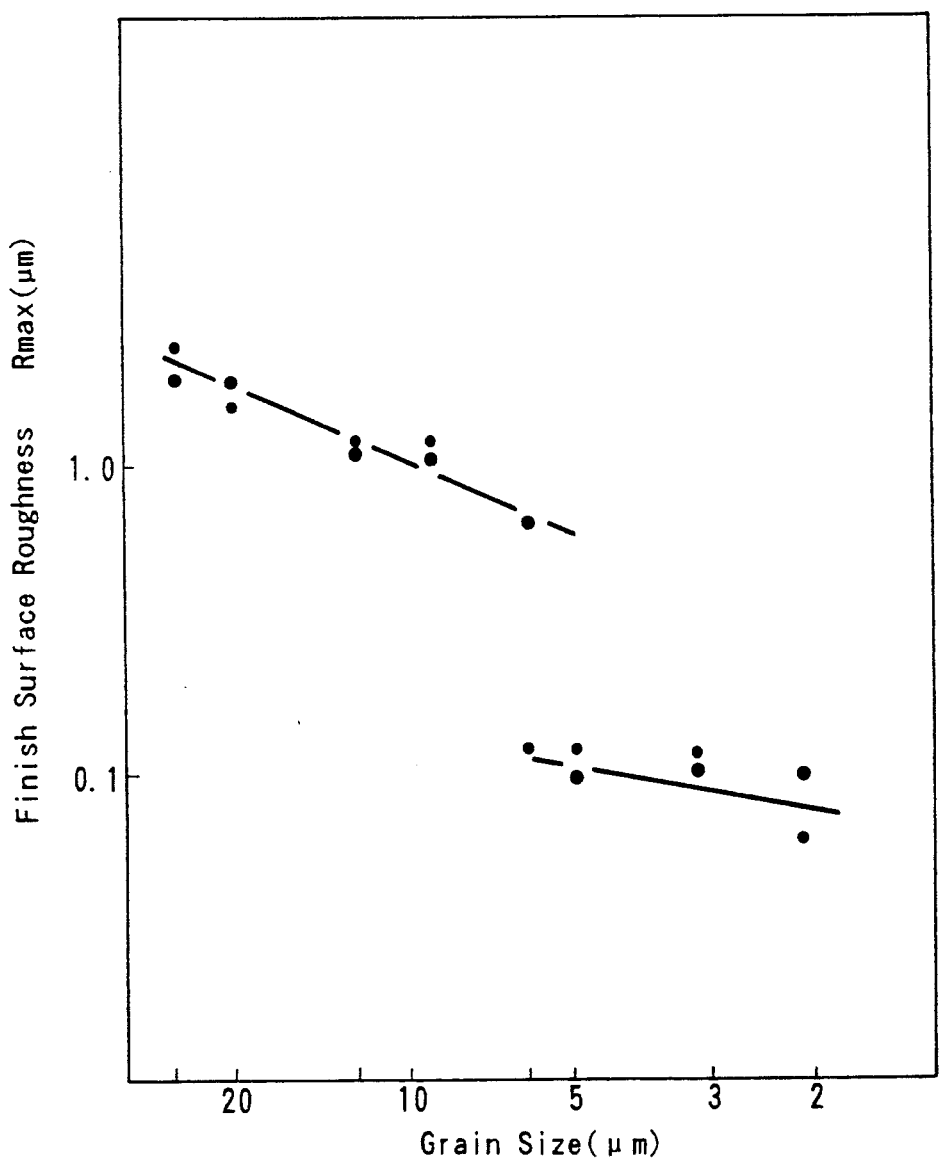
FIG. 2 is a graph showing relation between grain size of grinding stone and finish surface roughness R max.

Secondly, the one surface of the GaAs wafer on which the semiconductor element is formed is completely covered with a film made of organic material etc. and thereafter the wafer is mounted on a grinding machine by holding the covered surface thereof on a rotational stage of the grinding machine to grind the back side surface of the wafer. In the grinding, that is a so called as a back grinding, the rotational stage mounting the wafer thereon is rotated and forwarded to a grinding stone rotating and located so as to face to the rotational stage and as the result the back side of the wafer is made in contact with the grinding stone to be ground. Usually, a wafer rotation down-feed method is used. as grinding resistance can be kept constant in it. And a diamond grinding stone with an average grain size of 6 micro-meters or larger is used. The reason why the average grain size of 6 or larger is adopted is that grinding speed would drastically decrease with a smaller grain size because the finish must be of mirror grinding. And, in case of the average grain size of 6 micro-meters or larger, surface finish roughness (R max) falls under approximately 1. This roughness enables the surface to be finished to nearly a desired value (0.2 to 0.5 micro-meters) with the chemical etching treatment following the prior grinding treatment. FIG. 2 shows a relation between an average grain of a diamond grinding stone (horizontal axis) and a roughness (R max) (vertical axis) in the surface to be finished. As shown in FIG. 2, when the average grain changes from 6 micro-meters to 25 micro-meters, in response to the change, the roughness changes from 0.7 micro-meters to 3 micro-meters. Further in about 6 micro-meters of the average grain, the amount of R max changes incontinuously. This shows that 6 micro-meters in a size of the average grain is critical value. Generally, such incontinuous change in R max can not be observed in the grinding in Si wafer and such incontinuous change was also observed by a scanning electron microscope.

Next, the back surface of the wafer is chemically etched without any further grinding treatment. In the chemical etching step 3, the side of the GaAs substrate on which the semiconductor element is formed is covered with a protection film, before the substrate is soaked in a mixture of ammonia, hydrogen peroxide and water. The mixture should have a very low etching speed. An example of the mixing ratio of such a mixture is $NH_4OH:H_2O_2:H_2O = 1:1:10$, and the substrate is soaked in it for about 20 seconds. Various liquid mixture can be used as an etchant, for example, phosphoric based etchant, potassium-hydroxide based etchant or aqua regia etc. The step chemically etches the back surface of the GaAs wafer by 0.6 micro-meters or more.

Figure 3:
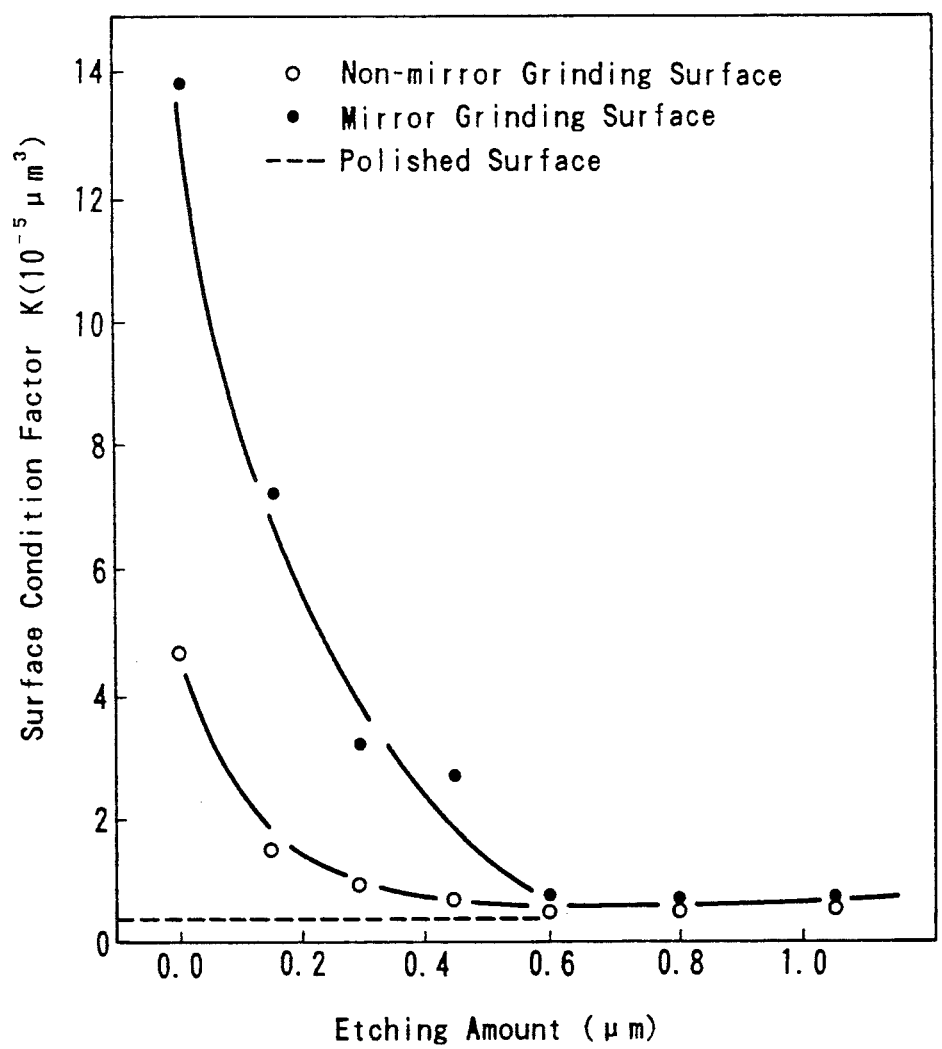
FIG. 3 is a graph showing relation between amount of etching and surface condition factor K of the back surface of GaAs substrate.

The amount of etching should be 0.6 micron-meters or more because the thickness of the deformed layer yielded on the back surface of the GaAs wafer by the previous grinding is about 0.6 micro-meters. A bend or the like in the wafer can be satisfactorily removed only by removing the deformed layer. FIG. 3 shows a relation between etching amount and surface condition factor (K) on the back surface of the substrate, and the surface condition factor corresponds to a bend degree of the wafer. The relation shown in FIG. 3 proves the etching amount is sufficient, because K value is restored to the same level as that of polished surface at 0.6 micrometers etching (See "Technique of GaAs wafer mirror grinding" in Super-Precision Machining manual). In FIG. 3, a broken line shows polished surface, white dots non-mirror grinding (rough grinding) and filled dots mirror grinding respectively.

Semiconductor elements were manufactured by the above method and the Die-Shear Strength was compared between following two cases:

(1) mirror grinding the back surface of the wafer to make R max to be 0.1 micro-meters and thereafter etching it by 0.1 micro-meters; and (2) rough grinding the back surface of the wafer to make R max to be 1 micro-meter and thereafter etching it by 0.6 micro-meters.

And it was observed that the strength was 1.5 kg/mm in the both cases. In addition, no cracking was caused in a 5×5 mm chip by 1000 cycle thermal impact of −65° C. to +150° C., with 0.6 micro-meter etching even in case that R max was 1 micro-meter.

Further, the applicant (inventor) measured "the Fracture Stress" of GaAs substrates respectively manufactured by the following two methods 1 and 2, by two different methods, one is a so-called "Four-Point Loading method" and the other is a so-called "Biaxial Loading method", (1) Method 1, Which is corresponding to a conventional method: Rough-grinding, Mirror-grinding and chemical etching are applied to a back surface of the substrate.

(2) Method 2, Which is corresponding to a method according to the present invention;

Rough grinding and chemical etching are applied to a back surface of the substrate without the application of Mirror grinding. Table I shows "Fracture Stress data" obtained by the Four-point Loading method and Table II shows "Fracture Stress data" obtained by the Biaxial Loading method.

TABLE I

| FRACTURE STRESS DATA FOR FOUR-POINT LOADING | | | |
|---|---|---|---|
| Manufacturing method | Thickness | Mean Fracture Stress | Weibull Modulus |
| 1 | 450 μm | 163 | 2.2 |
| 1 | 300 μm | 156 | 3.6 |
| 1 | 200 μm | 181 | 2.4 |
| 2 | 450 μm | 182 | 3.3 |
| 2 | 300 μm | 173 | 3.4 |
| 2 | 200 μm | 163 | 7.3 |
| 2 | 140 μm | 154 | 2.1 |

TABLE II

| FRACTURE STRESS DATA FOR BIAXIAL LOADING | | | |
|---|---|---|---|
| Manufacturing method | Thickness | Mean Fracture Stress | Weibull Modulus |
| 1 | 450 μm | 187 | 3.1 |
| 1 | 300 μm | 179 | 2.5 |
| 1 | 200 μm | 199 | 1.9 |
| 2 | 450 μm | 129 | 5.5 |
| 2 | 300 μm | 110 | 9.9 |
| 2 | 200 μm | 102 | 5.8 |
| 2 | 140 μm | 114 | 6.4 |

The above results shown in the tables I and II was published in a paper titled as "High Mechanical Reliability of Back-ground GaAs LSI Chips with Low Thermal Resistance" on pages 890 to 896 in Proceedings of the 41st Electronic Components and Technology Conference (ECTC) held on May 13 to 15, 1991 at Atlanta in U.S.A., by the applicant (inventor) the present invention.

As shown in the tables I and II, Fracture Stress data of the substrates manufactured by the two method 1 and 2 are substantial equal to each other. Therefore, it can be understood that the substrate manufactured by the method 2 has the substially same strength as that of the substrate manufactured by the method 2.

After the above chemical etching, GaAs wafer is divided into individual IC chip by a dicing machine. The divided IC chip is die bonded on a ceramic plate by an eutectic alloy using AuSu etc. Besides, before the die bonding, the back surface of the GaAs is metalized by Ti evaporation etc. and further Au layer is deposited thereon.

As described above, according to the present invention, a combination of the high speed grinding and the chemical etching enables a semiconductor element with sufficiently strong GaAs substrate to be manufactured in a short time of period.

Additionally, mirror grinding treatment can be eliminated, which simplifies manufacturing facilities and shortens manufacturing time. Consequently the present invention enables the semiconductor element to be manufactured at a low cost.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of manufacturing a semiconductor device comprising the steps of: forming a semiconductor element on one of major surfaces of a GaAs substrate; a grinding of the substrate to make the GaAs substrate to a predetermined thickness by grinding the other surface of the GaAs substrate with a grinding stone having an average grain size of 6 micro-meters or larger; and a chemical etching of the other surface of the substrate by 0.6 micro-meters or more just after the grinding step, without any further grinding treatment done on the other surface, just after the grinding step.

2. A method according to claim 1, wherein said grinding step is of grinding said GaAs substrate using a diamond grinding stone.

3. A method according to claim 1, wherein said grinding step is of grinding said GaAs substrate using a diamond grinding stone of which an average grain size is larger than 6 micro-meters and smaller than 25 micro-meters.

* * * * *